US011316017B2

(12) United States Patent
Lenoble

(10) Patent No.: US 11,316,017 B2
(45) Date of Patent: Apr. 26, 2022

(54) FIELD-EFFECT TRANSISTOR WITH A TOTAL CONTROL OF THE ELECTRICAL CONDUCTIVITY ON ITS CHANNEL

(71) Applicant: LUXEMBOURG INSTITUTE OF SCIENCE AND TECHNOLOGY (LIST), Esch-sur-Alzette (LU)

(72) Inventor: Damien Lenoble, Wellin (BE)

(73) Assignee: Luxembourg Institute Of Science and Technology (LIST), Esch-sur-Alzette (LU)

( * ) Notice: Subject to any disclaimer, the term of this patent is extended or adjusted under 35 U.S.C. 154(b) by 100 days.

(21) Appl. No.: 16/651,553

(22) PCT Filed: Sep. 27, 2018

(86) PCT No.: PCT/EP2018/076285
§ 371 (c)(1),
(2) Date: Mar. 27, 2020

(87) PCT Pub. No.: WO2019/063703
PCT Pub. Date: Apr. 4, 2019

(65) Prior Publication Data
US 2020/0266277 A1    Aug. 20, 2020

(30) Foreign Application Priority Data

Sep. 27, 2017    (LU) .................................... 100461

(51) Int. Cl.
*H01L 29/00* (2006.01)
*H01L 29/24* (2006.01)
(Continued)

(52) U.S. Cl.
CPC ...... *H01L 29/242* (2013.01); *H01L 21/02565* (2013.01); *H01L 21/02579* (2013.01);
(Continued)

(58) Field of Classification Search
None
See application file for complete search history.

(56) References Cited

FOREIGN PATENT DOCUMENTS

EP           1544907 A1    6/2005
WO    2018060240 A1    4/2018

OTHER PUBLICATIONS

Libretexts. "Intrinsic Semiconductors." Engineering LibreTexts, Libretexts, Jul. 6, 2021, https://eng.libretexts.org/Bookshelves/Materials_Science/Supplemental_Modules_(Materials_Science)/Semiconductors/Intrinsic_Semiconductors. (Year: 2021).*
(Continued)

*Primary Examiner* — Reema Patel
(74) *Attorney, Agent, or Firm* — Sandberg Phoenix & von Gontard P.C.

(57)    ABSTRACT

The first object of the invention is directed to field-effect gate transistor comprising (a) a substrate, (b) a source terminal, (c) a drain terminal, and (d) a channel between the source terminal and the drain terminal, the channel being a layer of $Cu_xCr_yO_2$ in which the y/x ratio is superior to 1. The field-effect gate transistor is remarkable in that the channel of $Cu_xCr_yO_2$ presents a gradient of holes concentration. The second object of the invention is directed to a method for laser annealing a field-effect gate transistor in accordance with the first object of the invention.

14 Claims, 3 Drawing Sheets

(51) Int. Cl.
    *H01L 21/02*     (2006.01)
    *H01L 21/16*     (2006.01)
    *H01L 27/12*     (2006.01)
    *H01L 29/66*     (2006.01)
    *H01L 29/786*     (2006.01)

(52) U.S. Cl.
    CPC ........ *H01L 21/165* (2013.01); *H01L 27/1211* (2013.01); *H01L 29/66969* (2013.01); *H01L 29/78696* (2013.01)

(56) References Cited

OTHER PUBLICATIONS

"Superior, adj., n., and adv." OED Online. Oxford University Press, Sep. 2021. Web. Sep. 29, 2021. (Year: 2021).*

International Search Report for corresponding PCT/EP2018/076285 dated Nov. 29, 2018.
Writen Opinion for corresponding PCT/EP2018/076285 dated Nov. 29, 2018.
J. Crepelliere et al, "Transparent conductive CuCrO 2 thin films deposited by pulsed injection metal organic chemical vapor deposition: up-scalable process technology for an improved transparency/conductivity trade-off", Journal of Materials Chemistry C: Materials for Opticaland Electronic Devices,vol. 4, No. 19, Mar. 28, 2016 (Mar. 28, 2016), p. 4278-4287.
Popa, P. Lunca et al, "Electrical and Optical Properties of Cu—Cr—O Thin Films Fabricated by Chemical Vapour Deposition", The Solid Films, Jun. 1, 2016, pp. 194-201, Elsevier, Amsterdam, NL.
Yu Ruei-Sung et al, "Characteristics of p-type transparent conductive CuCrO2thin films", Applied Surface Science,vol. 282, May 12, 2013, p. 92-97.

* cited by examiner

FIELD-EFFECT TRANSISTOR WITH A TOTAL CONTROL OF THE ELECTRICAL CONDUCTIVITY ON ITS CHANNEL

CROSS-REFERENCE TO RELATED APPLICATIONS

The present invention is the US national stage under 35 U.S.C. § 371 of International Application No. PCT/EP2018/076285, which was filed on Sep. 27, 2018, and which claims the priority of application LU 100461 filed on Sep. 27, 2017, the content of which (text, drawings and claims) are incorporated here by reference in its entirety.

FIELD

The invention is directed to the field of transistor, more specifically to field-effect transistor wherein the electronic properties are modified and which are potentially optically transparent.

BACKGROUND

A transistor is a semiconductor device used to amplify or switch electrical signals and electrical power. A field-effect transistor (FET) is a transistor that uses an electrical field to control the electrical behaviour of the device and is also called unipolar transistor since it involves a single-carrier-type operation. A field-effect bottom-gate transistor is a transistor wherein the gate terminal is covering the substrate and is a coated with a dielectric layer. The voltage at the gate terminal can control the current between the source terminal and the drain terminal. A field-effect top-gate transistor is a transistor wherein the gate terminal is covering a dielectric layer.

The channel of a transistor, which is located between the source terminal and the drain terminal is made of a semiconductor material, for example $CuCrO_2$.

The synthesis and characterization of highly p-type conductive Cu—Cr—O delafossite thin films has been reported in the studies of Popa P. L., et al. (Applied Materials Today, 2017, 9, 184-191). Conductivities greater than 100 S $cm^{-1}$ and optical transmittances around 40-50% were measured for non-extrinsically doped films. The determined stoichiometry evidenced a massive deficit of copper, totally compensated by an excess of chromium ($Cu_{0.66}Cr_{1.33}O_2$). An intrinsic defect, never observed or suggested before, was evidenced using transmission electron microscopy and furthermore suggested as possible source of high carrier concentrations in as-deposited films. It consists in finite lines of copper chained vacancies randomly distributed within crystalline grains.

Upon an annealing process at 900° C. these defects are corrected while the electrical conductivity drops almost six orders of magnitude concluding in a carrier concentration drop from $10^{21}$ to $10^{17}$ $cm^{-3}$ or lower.

No chemical changes are observed during the process at the average level whilst the delafossite structure remains unaltered.

The experimental results showed the metastable nature of these defects responsible for the conduction in off-stoichiometric copper chromium delafossite.

The controlled modulation of the electrical conductivity of the semiconductor material onto a transistor relying on transparent Cu—Cr—O conductive channel has never been demonstrated.

SUMMARY

The invention described hereafter has been generated within the research project entitled "Defect Engineering of P-type Transparent Oxide Semiconductor", supported by the National Research Fund, Luxembourg (Ref. C12/MS/3959502/DEPTOS).

The invention has for technical problem to alleviate at least one of the drawbacks present in the prior art. In particular, the invention has for technical problem to provide a transistor which presents a channel with a total control of its electrical conductivity, as well as a method for forming such p-type (holes conductivity) of transistor being partially optically transparent.

The first object of the invention is directed to field-effect gate transistor comprising (a) a substrate, (b) a source terminal, (c) a drain terminal, and (d) a channel between the source terminal and the drain terminal, the channel being a layer of $Cu_xCr_yO_2$ in which the y/x ratio is superior to 1. The field-effect gate transistor is remarkable in that the channel of $Cu_xCr_yO_2$ presents a gradient of holes concentration.

Advantageously, the field-effect gate transistor comprises a source and a drain made by the layer of $Cu_xCr_yO_2$ and are of the p+ type and the channel is of the p- type.

According to an exemplary embodiment, the gradient is a gradient decreasing from the drain terminal to the channel and increasing from the channel to the source terminal.

According to an exemplary embodiment, the field-effect gate transistor comprises copper vacancies in the crystal structure of $Cu_xCr_yO_2$.

According to an exemplary embodiment, the copper vacancies chains in the crystal structure of $Cu_xCr_yO_2$ are constituted in amount comprised between 2 and 20 Cu-vacancies.

According to an exemplary embodiment, the Cr/Cu ratio (y/x ratio) is superior to 2.

According to an exemplary embodiment, the channel consists of a layer of $Cu_{0.66}Cr_{1.33}O_2$.

According to an exemplary embodiment, the $Cu_xCr_yO_2$ is an intrinsic transparent semiconductor.

According to an exemplary embodiment, the substrate is glass, Si, $Si/Si_3N_4$, ITO, $SiO_2$ or any dielectric layer or any plastic materials, preferentially glass.

According to an exemplary embodiment, the gate terminal of the field-effect gate transistor is covering the substrate and is coated with a dielectric layer.

The second object of the present invention is to provide a method for laser annealing a field-effect gate transistor according to the first object of the invention, the method comprising the steps of (a) providing a field-effect gate transistor with a channel as external surface of the field-effect gate transistor, the channel being made of $Cu_xCr_yO_2$ wherein the y/x ratio is superior to 1; and (b) irradiating the channel with a laser beam. The method is remarkable in that in step (b), the channel is irradiated according to a gradient decreasing from the drain terminal to the channel and increasing from the channel to the source terminal.

Advantageously, step (a) comprises providing also a source and a drain of the field-effect gate transistor made of $Cu_xCr_yO_2$.

Advantageously, the source, drain and channel are irradiated according to a gradient decreasing from the drain to the channel and increasing from the channel to the source.

According to an exemplary embodiment, the laser beam has a maximum power density comprised between 7 $W/cm^2$ and 10 $W/cm^2$ and a minimum power density comprised between 1 $W/cm^2$ and 3 $W/cm^2$.

According to an exemplary embodiment, the step (b) is carried out at a temperature comprised between 600° C. and 1000° C. during a time comprised between 1 second to 1800 seconds.

According to an exemplary embodiment, the method further comprises a step (c) of cooling which is performed after step (b).

The invention is particularly interesting in that the control of the number of charge carriers in the channel allows the smooth integration of such p-type FET into transparent electronic devices or circuits or even optoelectronic devices.

DRAWINGS

DETAILED DESCRIPTION

Figure 1:
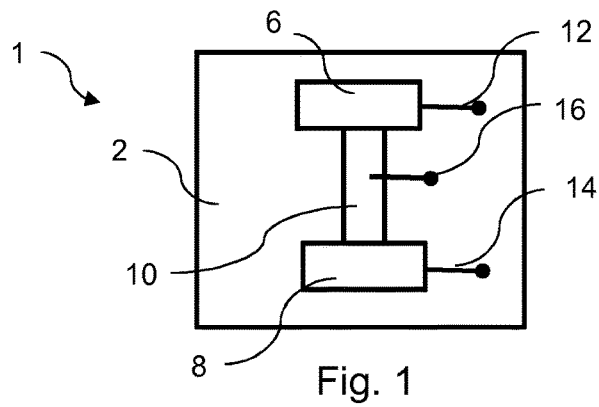
FIG. 1 is an exemplary schematic view of a field-effect transistor according to the invention, in accordance with various embodiments of the invention.

With reference to FIG. 1, the field-effect transistor (FET) 1 of the present invention comprises one substrate 2, which is chosen from glass, Si, $Si/Si_3N_4$, $SiO_2$, ITO, any dielectric material/layer or any plastic material like Kapton.

In various embodiments, transparent substrates are employed, in order to provide transparent properties to the transistor. Glass, which may be covered or not by ITO, is thus the substrate that is generally used.

The FET of the present invention has a source 6 with a source terminal 12, a drain 8 with a drain terminal 14, and a channel 10 with a gate terminal 16. The channel 10 extends between the source 6 and the drain 8.

The source 6, drain 8 and channel 10 are advantageously made of $Cu_xCr_yO_2$, via MOCVD deposition of $Cu_xCr_yO_2$ delafossite thin-films. The subscripts x and y are positive numbers whose the sum is equal or inferior to 2.

It has been revealed that a much higher concentration of Cr than Cu is present. Typically the Cr/Cu ratio is superior to 1 (y/x ratio>1).

In various embodiments, the $Cu_xCr_yO_2$ used in the present invention is an intrinsic semiconductor (or an undoped semiconductor). It is also highlighted that $Cu_xCr_yO_2$ has been to take advantage of its transparency.

In various embodiments, the crystalline structure of the material present of Cr/Cu ratio superior to 2 (y/x ratio>2) and has been identified as being $Cu_{0.66}Cr_{1.33}O_2$.

The copper chain vacancies in the crystal structure of $Cu_xCr_yO_2$ are constituted in average by Cu vacancies in an amount ranging from 2 to 20.

When the channel of the FET is irradiated with a laser beam (the laser beam has a maximum power density comprised between 7 $W/cm^2$ and 10 $W/cm^2$ and a minimum power density comprised between 1 $W/cm^2$ and 3 $W/cm^2$, in one example the laser beam has a power density equal to 4 $W/cm^2$), it is possible to modulate locally the electrical conductivity of the $Cu_xCr_yO_2$ layer or of the $Cu_{0.66}Cr_{1.33}O_2$ layer.

This local annealing has been carried out at a temperature comprised between 600° C. and 1000° C. during a time comprised between 1 second and 1800 seconds. Typically, the local annealing step is ranging from 1 second to 20 seconds.

Figure 2:
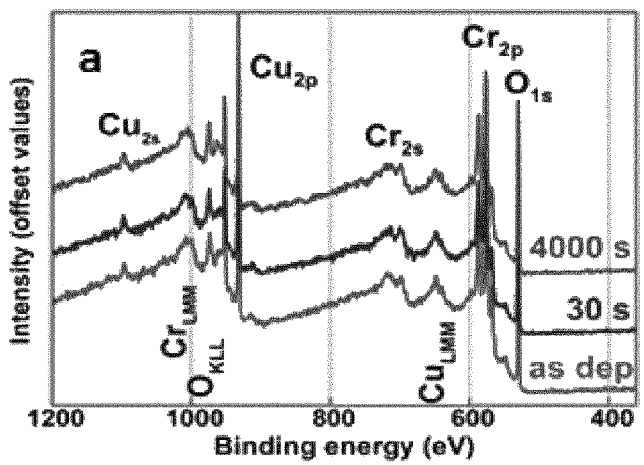
FIG. 2 is an exemplary illustration of a comparison between the XPS spectrum of $Cu_{0.66}Cr_{1.33}O_2$ as-deposited and as-annealed after 30 seconds and 4000 seconds, in accordance with various embodiments of the invention.

XPS spectrum (FIG. 2) demonstrates that the material, for instance in the case of $Cu_{0.66}Cr_{1.33}O_2$, does not change in composition, even after an annealing of 4000 seconds.

Figure 3:
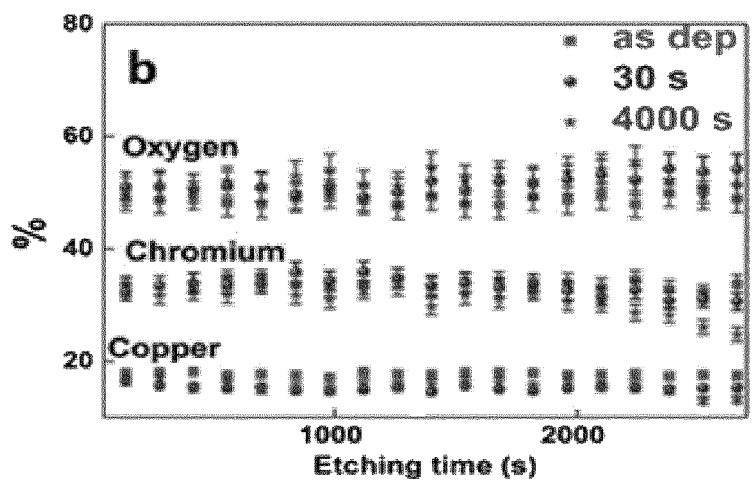
FIG. 3 is an exemplary illustration of an elemental composition of the p– oxide type material in function of the etching time, in accordance with various embodiments of the invention.

The plot depicted on FIG. 3 shows the results of an etching experiment. More precisely, it shows the composition of the p-oxide material in function of the etching time. This is a good indication that no alteration of the composition of the material is occurring during the annealing.

Figure 4:
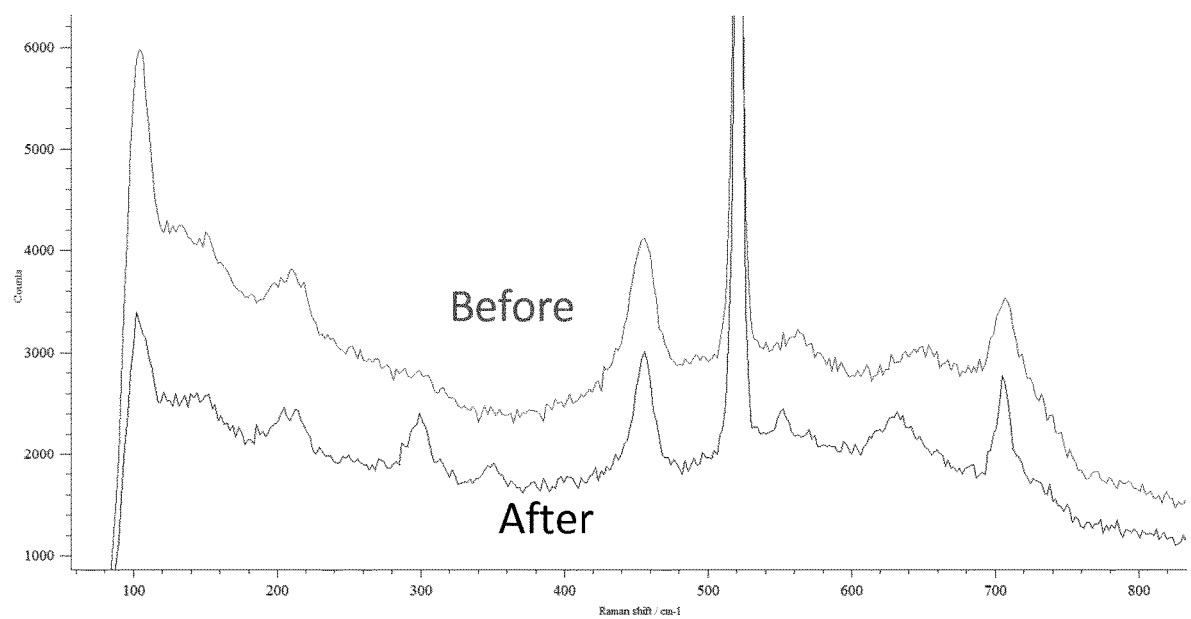
FIG. 4 is an exemplary illustration of a Raman spectrum of the $Cu_{0.66}Cr_{1.33}O_2$ layer as-deposited and as-annealed, in accordance with various embodiments of the invention.

In fact, during the deposition of $Cu_xCr_yO_2$ onto the substrate, the material has several defects, related to the holes (positive charge carrier) in the atomic lattice of the material. By annealing the material, it has been found that these holes disappear. This "healing" of the atomic lattice can be observed by Raman spectroscopy (see FIG. 4).

The Raman spectrum shows that the p-oxide layer of $Cu_{0.66}Cr_{1.33}O_2$ as-deposited does not present a Raman peak at about 300 $cm^{-1}$ (top plot on FIG. 4, marked as "before") This absence of peak is featuring the presence of Cu-vacancies chains. Once the number of these crystalline defects diminishes, this peak appears. After annealing, it can be seen that the Raman spectrum does display this peak (below plot on FIG. 4, marked as "after").

Figure 5:
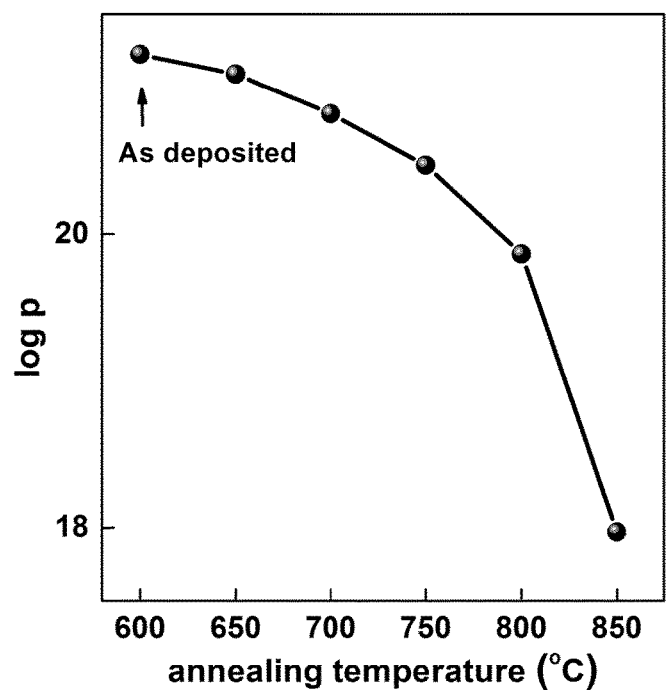
FIG. 5 is an exemplary illustration of an evolution of charge carrier in function of the annealing temperature, in accordance with various embodiments of the invention.

FIG. 5 shows the concentration of charge carrier decreasing in accordance with the annealing temperature. Therefore, if less charge carriers are present, the insulator behavior of the material is increased.

The KPFM (Kelvin Probe Force Measurement) studies were thus performed to obtain information about the composition and the electronic state of the local structures on the surface of the materials. KPFM studies have been carried on six samples, three from each set: both as-deposited reference samples plus two samples from a first set (15 min, 700° C. and 850° C.) and two from a last set (900° C., 30 s and 4000 s).

The measurements were performed in alternate way between HOPG (Highly Oriented Pyrolytic Graphite) and one of the samples. The values are always compared to the latest reference value to avoid possible fluctuations of the tip work function (e.g. due to contaminations). In order to compensate the vacuum levels misalignment KPFM insert the voltage $V_{DC}=(\Phi_{tip}-\Phi_{sample})/e$ where $\Phi_{tip(Pt-Ir)}=5.5$ eV. The samples have different doping levels and different Fermi levels were expected. When acceptor concentration $N_a$ increases, a decrease of the Fermi is expected and an increase of the work function $\Phi$ should be measured.

$$Ef-Ev=(X+Eg)-\Delta Wf$$

For the copper delafossites, the electronic affinity $\chi$ is 2.1 eV while the band gap Eg is 3.2 eV.

Figure 6:
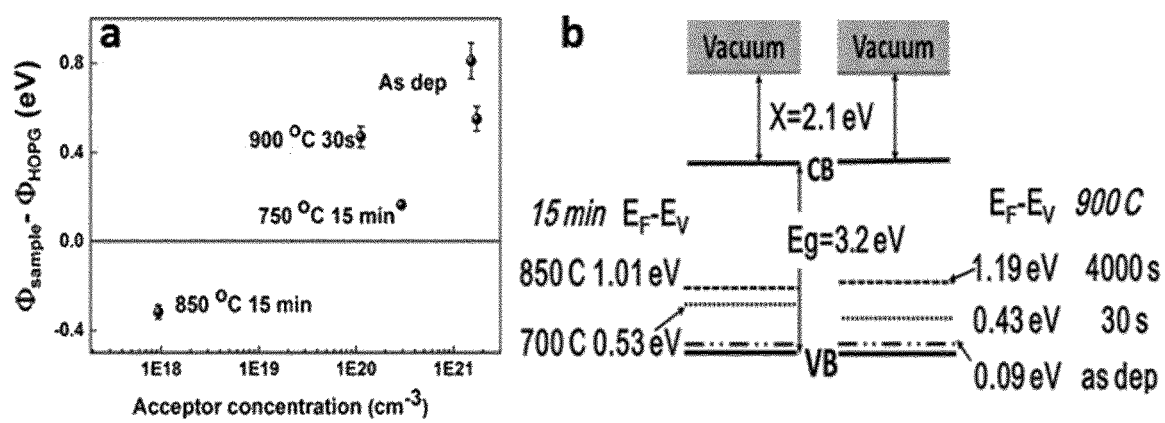
FIG. 6 is an exemplary illustration of results of KPFM studies, in accordance with various embodiments of the invention.

The results are shown in FIG. 6, where the work-function difference vs. HOPG ($\Phi_{HOPG}$=4.4 eV) is shown as a function of the carrier concentration.

It is to be noted that at mid-gap, namely at Eg=1.6 eV, the semiconductor is behaving as an intrinsic semiconductor, namely is not electrically conductive. For as-deposited samples (not annealed samples), the Fermi level is only 0.09 eV (thus far from the conduction band (CB) maximum) and the electrically conduction is therefore relatively high.

When the samples are treated for 30 seconds at a temperature of 900° C., it can be seen on FIG. 6 that the Fermi level has increased to 0.43 eV. For an annealing step of 4000 seconds, the Fermi level has even increased to 1.19 eV, which is almost equivalent to the mid-gap value (1.6 eV). In this case, one has shown that the electrical conductivity can be modulated and that from an electrically conductive material, one can reduce the electrical conductivity and one can modulate it.

For 15 minutes of annealing, at 700° C., the Fermi level has increased to 0.53 eV (from the 0.09 eV of the as-deposited material) while for 15 minutes at 850° C., the Fermi level has increased till 1.01 eV.

After performing the local annealing, the transistor is cooled at room temperature.

An advantage of this method of annealing after deposition is that, as the above, one can modulate the electrical conductivity of the material. Therefore, by doing a local annealing with the help of a laser beam, it has therefore been observed that the electrical conductivity can be modulated at specific place of the material. When the holes disappear, the electrical conductivity decrease, and vice versa. Laser annealing represents a major advantage since only a specific place of the carrier density in the material (actually, where the laser has been in contact with the material) can be modulated.

The local annealing is particularly advantageous when at least two of the source, drain and channel are made of $Cu_xCr_yO_2$ because the annealing can be modulated to adapt locally the concentrations of holes or positive charge carriers. For instance, the resulting FET shows a source and a drain of the p+ type whereas the channel is of the p− type.

The resulting FET is very important when used in any transparent electronic devices.

Figure 7:
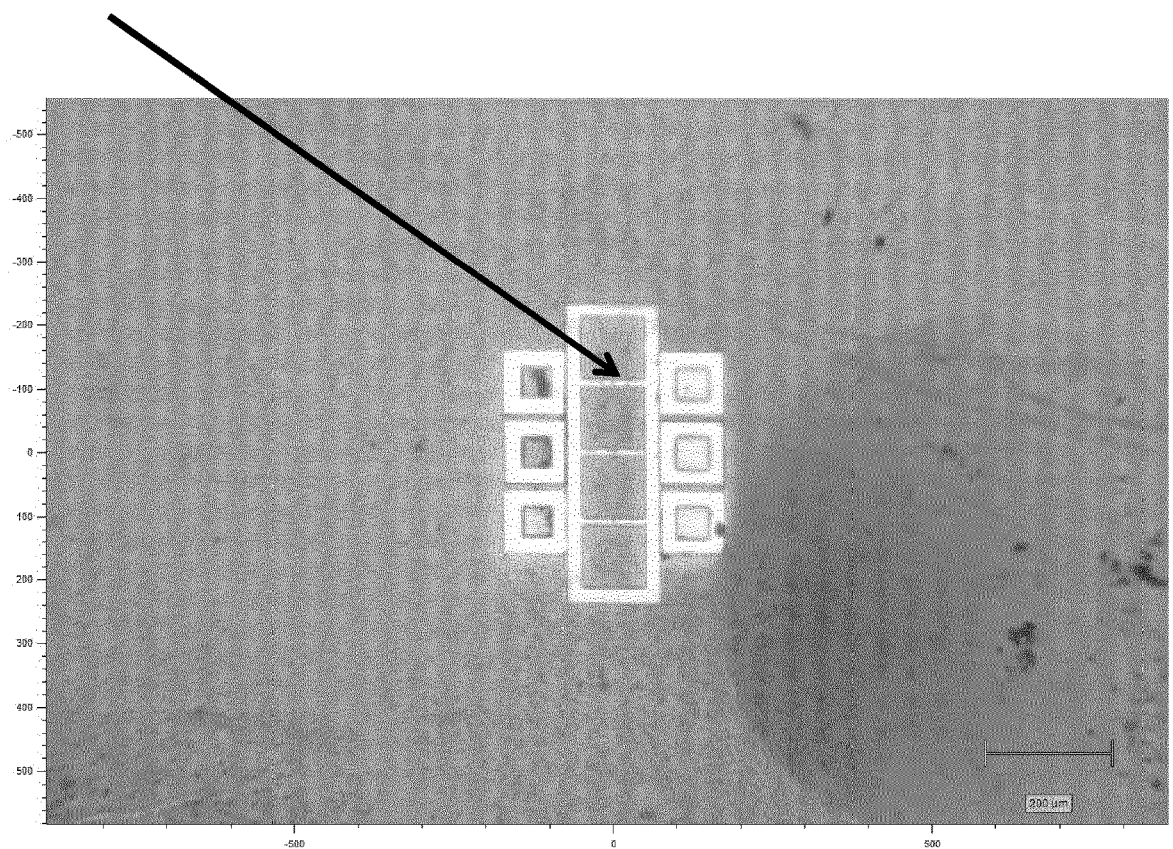
FIG. 7 is an exemplary SEM image of the transistor, in accordance with various embodiments of the invention.

FIG. 7 is a SEM (Secondary Electron Microscopy) image of a transistor. The arrow shows the channel, where the gradient of hole is created.

The invention claimed is:

1. A field-effect gate transistor, said field-effect gate transistor comprising:
   a substrate;
   a source terminal;
   a drain terminal; and
   a channel between the source terminal and the drain terminal, the channel being a layer of $Cu_xCr_yO_2$ in which the y/x ratio is greater than 1,
   wherein the channel of $Cu_xCr_yO_2$ presents a gradient of positive charge carrier concentration.

2. The field-effect gate transistor according to claim 1, wherein the gradient is a gradient decreasing from the drain terminal to the channel and/or increasing from the channel to the source terminal.

3. The field-effect gate transistor according to claim 1, wherein the field-effect gate transistor comprises copper vacancies in the crystal structure of $Cu_xCr_yO_2$.

4. The field-effect gate transistor according to claim 3, wherein the copper vacancies chains in the crystal structure of $Cu_xCr_yO_2$ are constituted in amount comprised between 2 and 20 Cu-vacancies.

5. The field-effect gate transistor according to claim 1, wherein the y/x ratio is greater than 2.

6. The field-effect gate transistor according to claim 1, wherein the channel consists of a layer of $Cu_{0.66}Cr_{1.33}O_2$.

7. The field-effect gate transistor according to claim 1, wherein the $Cu_xCr_yO_2$ is an intrinsic transparent semiconductor.

8. The field-effect gate transistor according to claim 1, wherein the substrate is glass, Si, $Si/Si_3N_4$, ITO, $SiO_2$ or any dielectric layer or any plastic materials.

9. The field-effect gate transistor according to claim 1, further comprising a gate terminal electrically connected to the channel, covering the substrate and coated with a dielectric layer.

10. A method for laser annealing a field-effect gate transistor, comprising the steps of
   (a) providing a field-effect gate transistor with a channel as external surface of the field-effect gate transistor, the channel being made of $Cu_xCr_yO_2$ wherein the y/x ratio is greater than 1; and
   (b) irradiating the channel with a laser beam,
   wherein in step (b), the channel is irradiated by scanning the surface of the channel non-homogeneously with regard to the local annealing temperature and/or annealing time.

11. The method according to claim 10, wherein, in step (b), the channel is irradiated according to a gradient decreasing from the drain terminal to the channel and increasing from the channel to the source terminal.

12. The method according to claim 10, wherein the laser beam has a maximum power density comprised between 7 W/cm² and 10 W/cm² and a minimum power density comprised between 1 W/cm² and 3 W/cm².

13. The method according to claim 10, wherein step (b) is carried out at a temperature comprised between 600° C. and 1000° C. during a time comprised between 1 second to 1800 seconds.

14. The method according to claim 10, wherein the method further comprises a step (c) of cooling which is performed after step (b).

* * * * *

UNITED STATES PATENT AND TRADEMARK OFFICE
CERTIFICATE OF CORRECTION

| | |
|---|---|
| PATENT NO. | : 11,316,017 B2 |
| APPLICATION NO. | : 16/651553 |
| DATED | : April 26, 2022 |
| INVENTOR(S) | : Lenoble et al. |

It is certified that error appears in the above-identified patent and that said Letters Patent is hereby corrected as shown below:

On the Title Page

"Item (12)" delete "Lenoble" and insert --Lenoble et al.--.

Please add the following inventors to the "item (72) Inventor:" after Inventor LENOBLE's name: Jonathan CREPELLIERE, Esch-sur-Alzette (LU); Renaud LETURCQ, Esch-sur-Alzette (LU); Petru LUNCA POPA, Esch-sur-Alzette (LU)

Signed and Sealed this
Twenty-first Day of March, 2023

Katherine Kelly Vidal
*Director of the United States Patent and Trademark Office*